US010718886B1

(12) United States Patent
Sharma et al.

(10) Patent No.: US 10,718,886 B1
(45) Date of Patent: Jul. 21, 2020

(54) OPTICAL SUBSTRATE AND TRANSPARENT ROUTING OF LIGHT SOURCES

(71) Applicant: Facebook Technologies, LLC, Menlo Park, CA (US)

(72) Inventors: Robin Sharma, Redmond, WA (US); Karol Constantine Hatzilias, Kenmore, WA (US); Vincenzo Casasanta, III, Woodinville, WA (US); Christopher Yuan-Ting Liao, Seattle, WA (US); Andrew John Ouderkirk, Redmond, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 33 days.

(21) Appl. No.: 16/038,765

(22) Filed: Jul. 18, 2018

Related U.S. Application Data

(60) Provisional application No. 62/675,504, filed on May 23, 2018.

(51) Int. Cl.
| *G02B 1/116* | (2015.01) |
| *G02B 6/43* | (2006.01) |
| *G02B 6/122* | (2006.01) |
| *H05K 1/02* | (2006.01) |
| *H05K 3/38* | (2006.01) |
| *H01L 23/49* | (2006.01) |
| *H01L 33/36* | (2010.01) |
| *G06F 3/01* | (2006.01) |
| *H04N 13/344* | (2018.01) |
| *G02B 6/12* | (2006.01) |

(52) U.S. Cl.
CPC ............ *G02B 1/116* (2013.01); *G02B 6/1225* (2013.01); *G02B 6/43* (2013.01); *G06F 3/013* (2013.01); *H01L 23/49* (2013.01); *H01L 33/36* (2013.01); *H04N 13/344* (2018.05); *H05K 1/0274* (2013.01); *H05K 3/385* (2013.01); *G02B 2006/12102* (2013.01); *H05K 2201/0108* (2013.01)

(58) Field of Classification Search
CPC ......... H01L 23/49; H01L 33/00; H01L 33/36; H05K 1/0274; H05K 3/385; G02B 6/43; G02B 6/1225; G06F 3/013; H04N 13/344
See application file for complete search history.

(56) References Cited

U.S. PATENT DOCUMENTS

| 6,462,356 | B1 * | 10/2002 | Koyama | ................ B82Y 20/00 257/13 |
| 2008/0284320 | A1 * | 11/2008 | Karkkainen | ........... B82Y 20/00 313/504 |

(Continued)

*Primary Examiner* — Thomas A Hollweg
*Assistant Examiner* — Mary A El-Shammaa
(74) *Attorney, Agent, or Firm* — Freestone Intellectual Property Law PLLC; Aaron J. Visbeek; Andrew J. Cameron

(57) ABSTRACT

A structure includes a first transparent conductive layer, a second transparent conductive layer, and an insulation layer disposed between the first transparent conductive layer and the second transparent conductive layer. A light source having a first node and a second node may have its first node electrically coupled to the first transparent conductive layer and its second node electrically coupled to the second transparent conductive layer. A via running though one of the transparent conductive layers may facilitate electrical routing to the light source.

19 Claims, 9 Drawing Sheets

(56) References Cited

U.S. PATENT DOCUMENTS

| | | | |
|---|---|---|---|
| 2010/0149139 A1* | 6/2010 | Kroll | G02B 26/0875 |
| | | | 345/204 |
| 2010/0163892 A1* | 7/2010 | Liu | H05K 1/0274 |
| | | | 257/89 |
| 2012/0081892 A1* | 4/2012 | Kubota | H01L 51/5265 |
| | | | 362/231 |
| 2012/0132930 A1* | 5/2012 | Young | H01L 31/0481 |
| | | | 257/84 |
| 2013/0208026 A1* | 8/2013 | Suzuki | H01L 33/36 |
| | | | 345/690 |
| 2013/0214255 A1* | 8/2013 | Hermes | H01L 51/5221 |
| | | | 257/40 |
| 2016/0044777 A1* | 2/2016 | Seong | H05K 1/0274 |
| | | | 174/253 |
| 2017/0148773 A1* | 5/2017 | Sakariya | H01L 25/0753 |
| 2018/0026074 A1* | 1/2018 | Lee | F21S 4/28 |
| | | | 362/219 |
| 2019/0140031 A1* | 5/2019 | Lamkin | H01L 27/14667 |

\* cited by examiner

OPTICAL SUBSTRATE AND TRANSPARENT ROUTING OF LIGHT SOURCES

CROSS-REFERENCE TO RELATED APPLICATIONS

This application claims priority to U.S. provisional Application No. 62/675,504 filed May 23, 2018 entitled, "Optical Substrate and Transparent Routing of Light Sources," which is hereby incorporated by reference.

TECHNICAL FIELD

This disclosure relates generally to optics and in particular to, but not exclusively to, optical substrates with electrical routing that is transparent or optically insignificant.

BACKGROUND INFORMATION

There are a variety of contexts where electrical components are included in an optical system. Conventionally, the electrical components are placed on the edge of the optical system so that the electrical components don't block or otherwise interfere with the light propagating through the optical system. In the case of an augmented reality (AR) or mixed reality (MR) headset, a user may be viewing computer generated images as well as viewing scene light from the ambient environment. In this particular case, illuminating the eye of the user for eye-tracking purposes enhances the viewing experience. However, conventional designs place the illumination light sources on the edges of the field of view of the user so that the illumination light sources (and corresponding routing) don't introduce noticeable occlusions into the field of view of the user, even when it may be advantageous to place the illumination light sources in the field of view.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Figure 1:
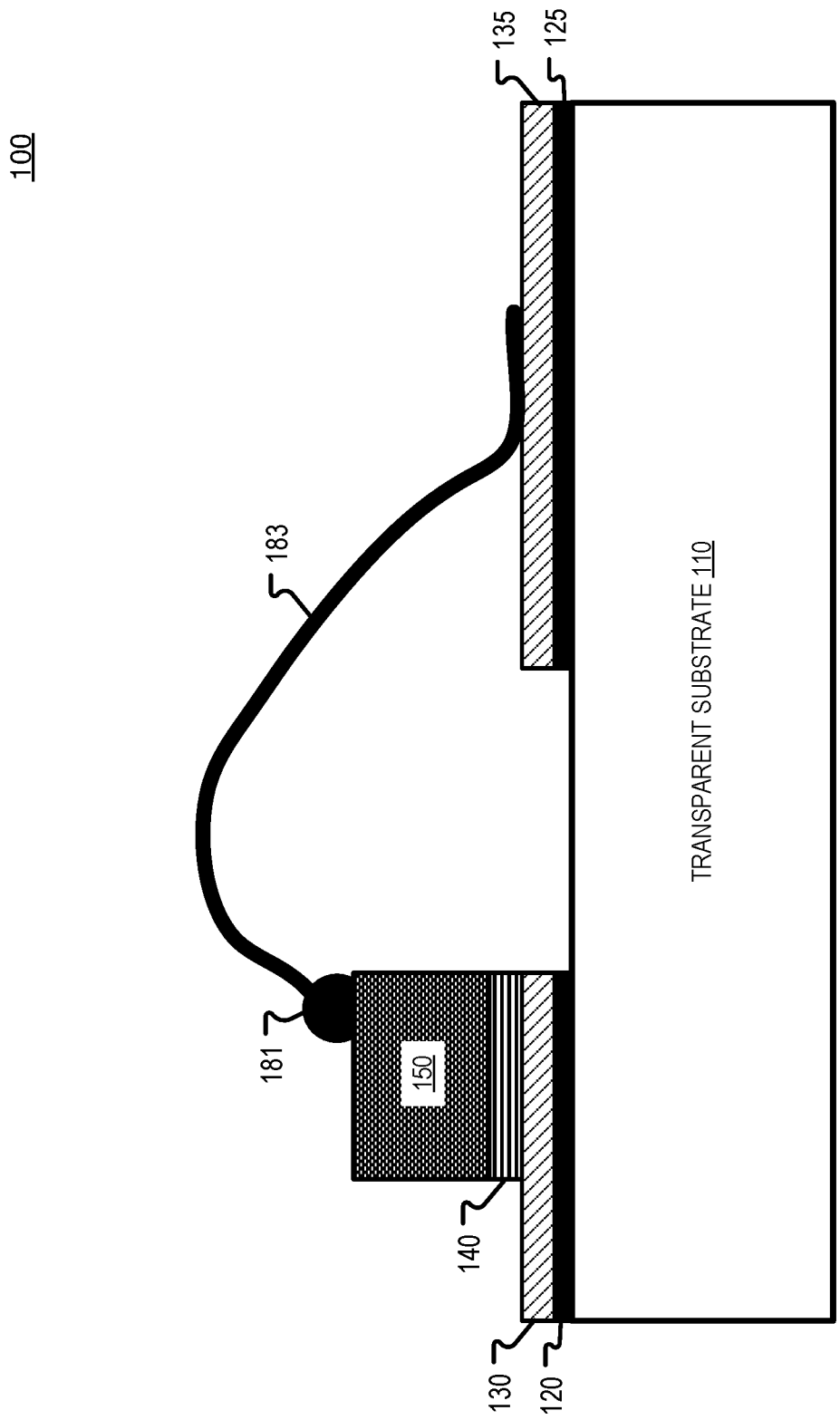
FIG. 1 illustrates a side view of a wire-bonded light source coupled to electrical traces on a transparent substrate, in accordance with an embodiment of the disclosure.

Embodiments of systems, devices, and structures that include transparent routing of electrical components or routing with minor occlusions on a transparent substrate are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The systems, devices and structures disclosed include transparent substrates that include transparent electrical routing or electrical routing that will not significantly impact an optical system. In one embodiment of the disclosure, an optical combiner in an Augmented Reality (AR) headset includes an array of light sources (e.g. micro-LEDs or vertical-cavity surface-emitting laser) that illuminate the eye with near infrared light. Although the light sources may be in the field-of view of a user of the headset, the light sources may be so small (e.g. 300 microns or less) as to be unnoticeable or of insignificant to a wearer. In one embodiment, very thin conductive electrical traces (e.g. gold) are routed to each light source so that each light source can be selectively illuminated. In one embodiment, the electrical routing to each light source may be transparent using transparent conductive traces (e.g. indium tin oxide) so that each light source can be individually selected for illumination. A multilayer transparent circuit board may include a first transparent conductive layer and a second transparent conductive layer with a transparent insulation layer isolating the first and second transparent conductive layers. In one embodiment, the first transparent conductive layer is segmented into conductive columns and the second transparent conductive layer is segmented into conductive rows in a crosshatch configuration. Vias may facilitate electrical routing between the first and second transparent conductive layer. As a result, of the thin routing and/or transparent routing techniques, light sources can illuminate the eye directly (instead of from an edge of the optical combiner)

without the light sources being noticed by the user, which improves the imaging accuracy for eye-tracking and other imaging application.

Embodiments of this disclosure further include a multilayer transparent conductive circuit board configured to be disposed less than 50 mm from a face of a user of a head mounted display. The multilayer transparent conductive circuit board may include a plurality of conductive traces and a plurality of semiconductor devices bonded to the conductive traces. A footprint of the semiconductors devices in the plurality of semiconductor devices may be smaller than 500×500 microns and the plurality of semiconductors may be configured as a display to provide image light to an eyebox area or configured as sensor arrays for eye-tracking. In one embodiment, the multilayer transparent conductive circuit board includes a first transparent conductive layer, a second transparent conductive layer, and a via running through the second transparent conductive layer and the insulation layer to the first transparent conductive layer. The via may include an insulator disposed on sidewalls of a void through the second transparent conductive layer. The via may include a conductive fill material contacting the first transparent conductive layer. The semiconductor devices may be bonded to the plurality of conductive traces with conductive adhesives or wire-bonds. The semiconductor devices in the plurality of semiconductor devices may be configured to be individually controlled and selectively modulated with digital-to-analog (DAC) circuits that control an electrical current driven through the semiconductor devices. The multilayer transparent conductive circuit board may be invisible and/or unnoticeable to a user when placed within 50 mm of a face of the user. The multilayer transparent conductive circuit board may generate an unnoticeable amount of scatter, diffraction, or haze due to the plurality of conductive traces and the plurality of semiconductor devices. These and other embodiments are described below with respect to FIGS. 1-8.

FIG. 1 illustrates a side view of a wire-bonded light source coupled to electrical traces on a transparent substrate, in accordance with an embodiment of the disclosure. Structure 100 of FIG. 1 includes a transparent substrate 110, adhesion layers 120 and 125, conductive traces 130 and 135, a die attach layer 140, a light source 150, and a wire bond that include a ball 181 and a wire 183. The transparent substrate 110 may be glass and may be included in a lens 821 or optical combiner of a head mounted display (HMD), such as HMD 800 illustrated in FIG. 8. The dimensions of the layers of structure 100 may be exaggerated for illustration purposes.

Adhesion layer 120 facilitates bonding conductive trace 130 to transparent substrate 110 and adhesion layer 125 facilitates bonding conductive trace 135 to transparent substrate 110. In one embodiment, adhesion layers 120 and 125 include Chromium (CR) or Titanium-Tungsten (TiW) and conductive traces 130 and 135 are gold (Au). In one embodiment, the adhesion layers are patterned onto transparent substrate 110 followed by an application of a gold film in a sputtering process.

Die attach layer 140 electrically couples a first node (e.g. cathode) of the light source 150 to conductive trace 130. In fabrication, the light source 150 may be first secured to structure 100 by a die attach mounting process followed by a wire-bonding of a second node (e.g. anode) of light source 150 to conductive trace 135. The wire bond (including ball 181 and wire 183) may be of a same material (e.g. gold) as the conductive trace 135. The die attach mounting process may include eutectic techniques or a conductive epoxy may be used to provide an electrical path between a conductive lead of the light source 150 and conductive trace 130.

Light source 150 may be a micro light emitting diode (micro-LED), an edge emitting LED, or a vertical-cavity surface-emitting laser (VCSEL). Light source 150 may emit non-visible light. In one embodiment, light source 150 emits near-infrared (NIR) light. In one embodiment, the NIR light emitted by the light source 150 is centered around 850 nm. In one embodiment, the NIR light emitted by the light source 150 is centered around 940 nm. In one embodiment, light source 150 is 200 microns or smaller so that it is not noticeable or barely noticeable when structure 100 is placed in a field of view of a human eye. In particular, any occlusion generated by structure 100 when placed in a near-eye optical combiner may be undetectable due to the closeness (e.g. within 50 mm) of the (tiny) occlusion to the eye.

Figure 2:
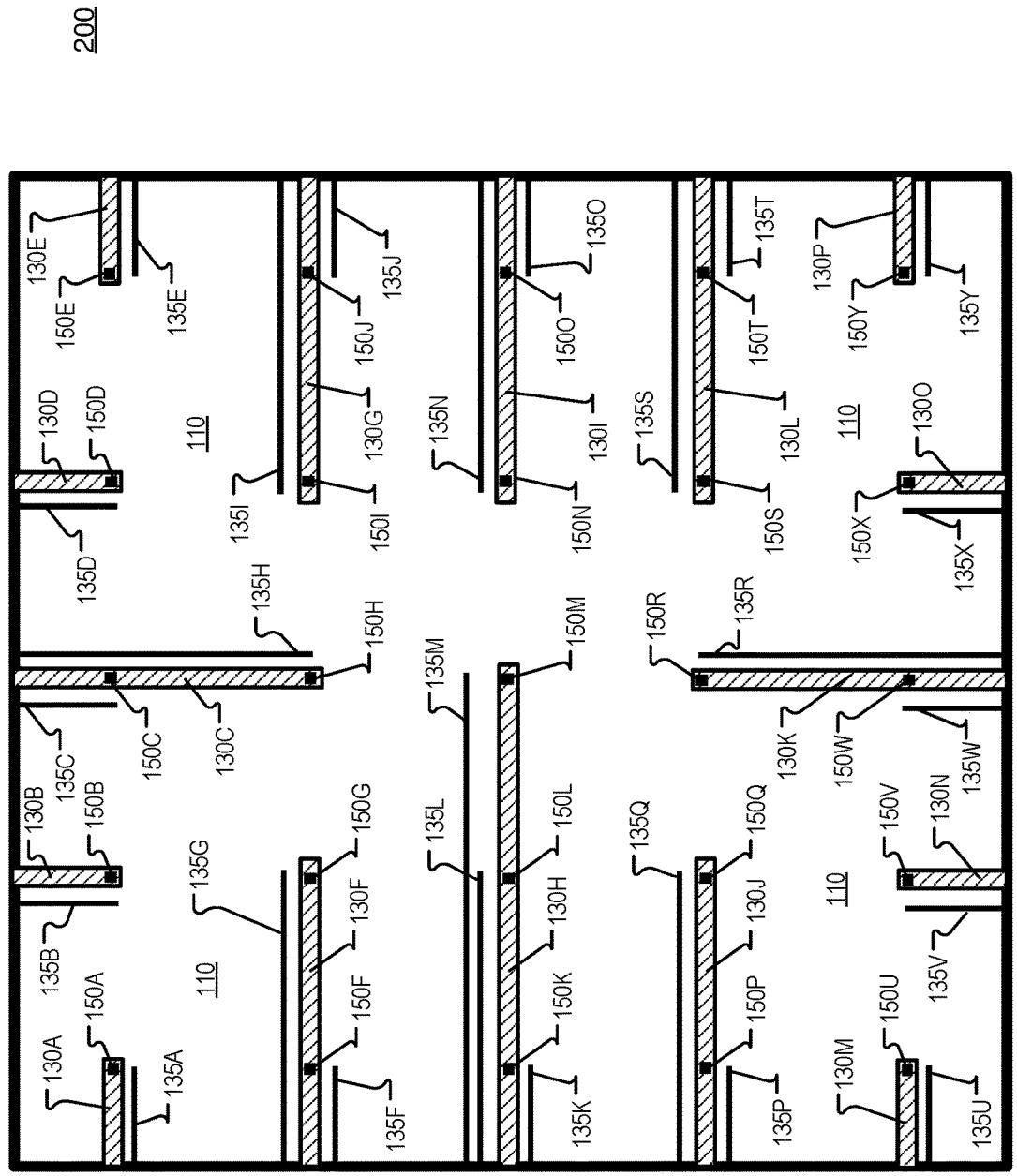
FIG. 2 illustrates a plan view of an array of light sources and corresponding electrical routing disposed on a transparent substrate, in accordance with an embodiment of the disclosure.

FIG. 2 illustrates a plan view of an array of light sources and corresponding electrical routing disposed on a transparent substrate 110, in accordance with an embodiment of the disclosure. Structure 200 of FIG. 2 includes a 5×5 array of light sources 150A-150Y disposed on transparent substrate 110 utilizing the structure illustrated in FIG. 1. In one embodiment, the pitch between light sources in both the x and y direction is approximately five mm.

In FIG. 2, conductive traces 130 and 135 provide electrical power to light sources 150. Traces 130 and 135 are routed so that each individual light source 150 can be selectively illuminated by providing electrical power to the light source. Each light source 150 has its own corresponding top-electrode trace 135 that is wire-bonded to the corresponding light source. For example, light source 150A has a corresponding top-electrode trace 135A, light source 150B has a corresponding top-electrode trace 135B, and so on. Notably, in the illustrated embodiment of FIG. 2, the bottom-electrode trace 130 is sometimes shared by multiple light sources 150. For example, bottom-electrode trace 130C provides electrical routing for both light source 150C and for light source 150H. The size of traces 130/135 in FIG. 2 have been exaggerated for illustration purposes and may be much smaller.

In operation, any of light sources 150 may be individually illuminated. For example, light source 150A may be illuminated by providing a driving voltage (e.g. ~3 VDC) to trace 135A while trace 130A is grounded to illuminate light source 150A with a driving current. Similarly, light source 150B may be illuminated by providing driving voltage (e.g. ~3 VDC) to trace 135B while trace 130B is grounded. To illuminate light source 150C, a driving voltage may be provided to trace 135C while trace 130C is grounded. To illuminate light source 150H, a driving voltage may be provided to trace 135H while trace 130C is grounded.

Structure 200 may be included in lens 821A or 821B to direct NIR light from the light sources 150 in an eyeward direction to illuminate an eye of a wearer of HMD 800. The capability to illuminate individual or particular groups of light sources 150/850 may improve the calibration and detection of an eye tracking system included in HMD 800.

Figure 3:
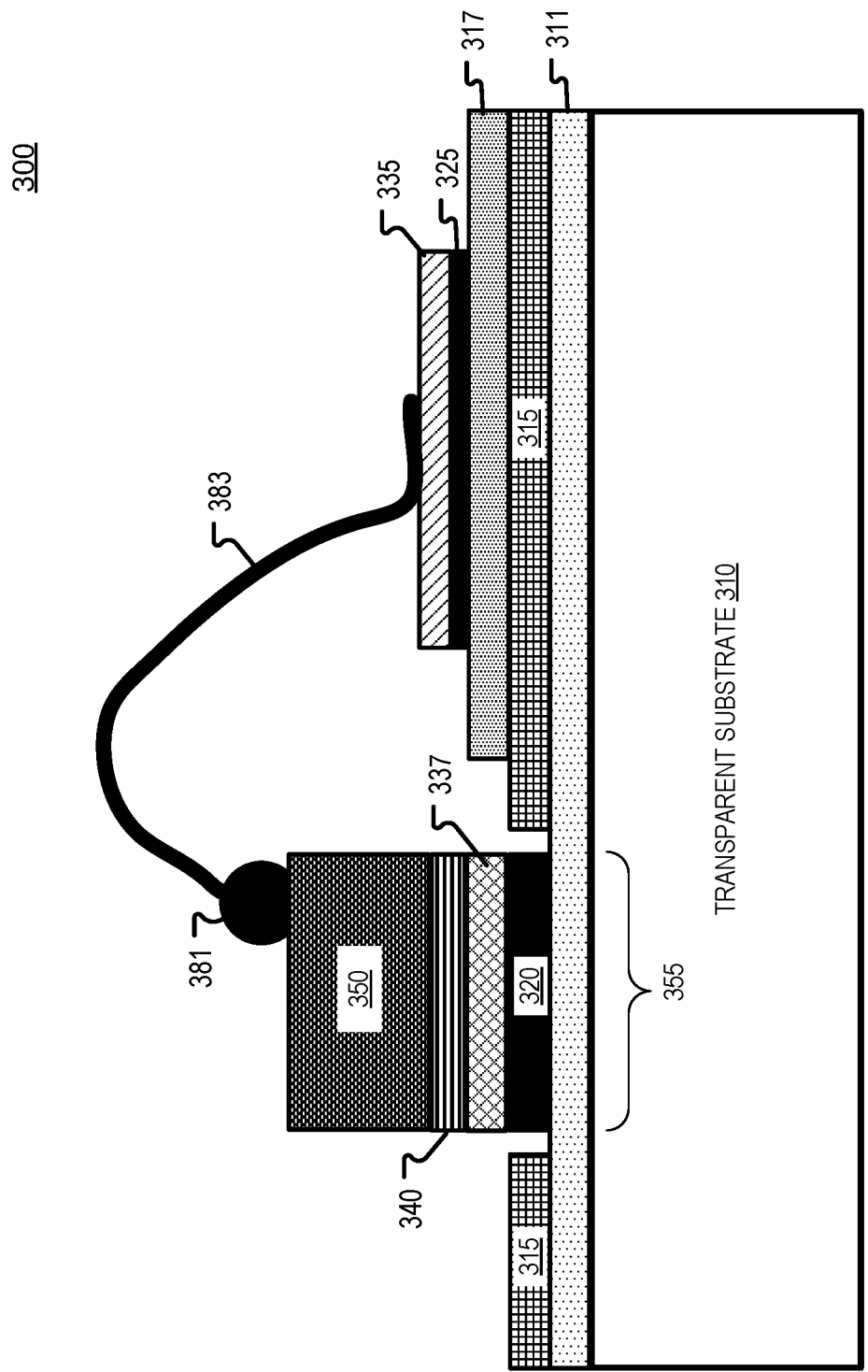
FIG. 3 illustrates a side view of a wire-bonded light source coupled to transparent electrical traces that are separated by a transparent insulation layer, in accordance with an embodiment of the disclosure.

FIG. 3 illustrates a side view of a wire-bonded light source coupled to transparent conductive layers that are separated by a transparent insulation layer, in accordance with an embodiment of the disclosure. Structure 300 of FIG. 3 includes a transparent substrate 310, a transparent conductive layer 311, an insulation layer 315, a transparent conductive layer 317, an activation layer 325, a conductive pad 335, an activation layer 320, a conductive pad 337, a die attach layer 340, a light source 350, and a wire bond that includes a ball 381 and a wire 383. The transparent substrate 310 may be glass or plastic and may be included in a lens 821 or optical combiner of a head mounted display (HMD), such as HMD 800 illustrated in FIG. 8. The dimensions of the layers of structure 300 may be exaggerated for illustration purposes.

Transparent conductive layers 311 and/or 317 may be a transparent conductive oxide, organic transparent conductors, nanowires, metal mesh, graphene, or other transparent conductive electrodes. In one embodiment, transparent conductive layers 311 and/or 317 include indium tin oxide (ITO), which is considered "transparent" by those skilled in the art due to its low light absorption (e.g. 90% or better transparency) in the great majority of the visible-light spectrum. In FIG. 3, insulation layer 315 electrically isolates transparent conductive layer 311 and 317. Insulation layer 315 may be silicon dioxide ($SiO_2$) and may be formed on transparent conductive layer 311 using a chemical vapor deposition (CVD) technique. Through selective etching or masking, the deposition of the insulation layer 315 can be limited to the illustrated area of insulation layer 315 and not deposited over the die window void 355. In one embodiment, insulation layer 315 includes tetraethoxysilane (TEOS) and may be formed using a spin coating process.

Light source 350 may be similar to light source 150. Light source 350 includes a first node (e.g. a cathode) and a second node (e.g. an anode) for illuminating the light source 350. In the illustrated embodiment, the anode is electrically coupled to the transparent conductive layer 311 and another node is electrically coupled to transparent conductive layer 317 via the wire bond including ball 381 and wire 383. A node of light source 350 is electrically coupled to the transparent conductive layer 311 via a die attach layer 340 (e.g. solder or conductive epoxy), a conductive pad 337 (e.g. gold) and activation layer 320 (e.g. tin). Activation layers 320 and 325 assist in adhering conductive pads 335 and 337 to transparent conductive layers 311 and 317, respectively. The other node of the light source 350 is electrically coupled to the transparent conductive layer 317 via the wire bond, the conductive pad 335 (which may be the same material as the wire bond), and the activation layer 325 (which may be the same material as activation layer 320). Conductive pad 335 may be adhered to the activation layer 325, which is adhered to the transparent conductive layer 317, in FIG. 3.

In one embodiment, (not illustrated), the layers 320, 337, and 340 are replaced by a conductive adhesive coupled between transparent conductive layer 311 and light source 350.

In FIG. 3, a die window void 355 runs through the insulation layer 315 (and optionally through transparent conductive layer 317) to expose transparent conductive layer 311 for connecting to the bottom node of light source 350. In the illustrated embodiment, the die window is sized to be slightly bigger than the footprint of light source 350 to accommodate the footprint size of the light source 350.

Figure 4:
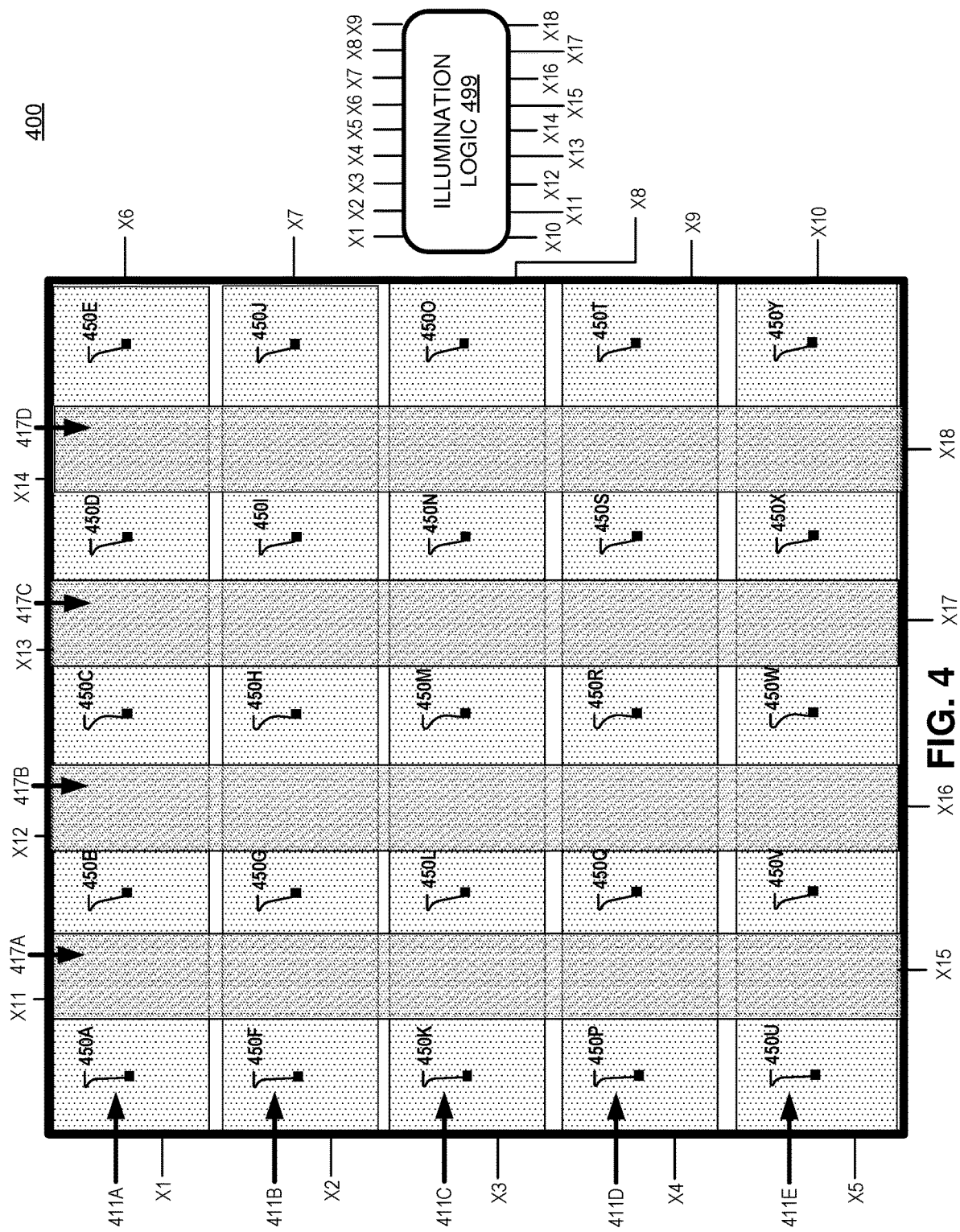
FIG. 4 illustrates a plan view of a transparent optical structure having transparent column traces and transparent row traces arranged in a crosshatch configuration to facilitate illumination of an array of light sources, in accordance with an embodiment of the disclosure.

FIG. 4 illustrates a plan view of a transparent optical structure 400 having transparent conductive row traces 411 and transparent conductive column traces 417 arranged in a crosshatch configuration to facilitate illumination of an array of light sources 450, in accordance with an embodiment of the disclosure. The transparent conductive row traces 411 may be positioned as the transparent conductive layer 311 in FIG. 3 and the transparent conductive column traces 417 may be positioned as the transparent conductive layer 317. An insulation layer having the characteristics of insulation layer 315 is disposed between the transparent conductive row traces 411 and transparent conductive column traces 417, although the insulation layer is not illustrated in FIG. 4.

In the illustrated embodiment, transparent conductive row traces 411 are disposed approximately orthogonal to the transparent conductive column traces 417.

A single layer of a transparent conductive material (e.g. transparent conductive oxide) may be segmented into a plurality of transparent conductive row traces 411A-411E. For example, a single ITO layer may be pattern etched to create a plurality of transparent conductive row traces of ITO that are electrically isolated from one another. A patterned mask may be utilized to fabricate an etching pattern. In one embodiment, a plasma etch technique is used to etch the ITO layer. After an insulation layer (similar to insulation layer 315) is disposed over the row traces 411, a second transparent conductive layer may be formed over the insulation layer. The second transparent conductive layer may then be segmented into a plurality of transparent conductive column traces 417A-417D that are electrically isolated from one another. Die window voids (such as die window void 355) may also be formed in an etching process that extends through the second transparent conductive layer and through the insulation layer (not illustrated in FIG. 4).

FIG. 4 includes illumination logic 499 coupled to selectively illuminate the light sources in the array of light sources by selectively providing electrical power to the column trace 417 and/or the row traces 411. In the illustrated embodiment, illumination logic 499 includes outputs X1-X18. By selectively driving outputs X1-X18, illumination logic may selectively illuminate light sources 450A-450Y.

Output X1 is coupled to row trace 411A, output X2 is coupled to row trace 411B, output X3 is coupled to row trace 411C, output X4 is coupled to row trace 411D, output X5 is coupled to row trace 411E, output X6 is coupled to row trace 411A, output X7 is coupled to row trace 411B, output X8 is coupled to row trace 411C, output X9 is coupled to row trace 411D, and output X10 is coupled to row trace 411E.

Output X11 is coupled to column trace 417A, output X12 is coupled to column trace 417B, output X13 is coupled to column trace 417C, output X14 is coupled to column trace 417D, output X15 is coupled to column trace 417A, output X16 is coupled to column trace 417B, output X17 is coupled to column trace 417C, and output X18 is coupled to column trace 417D.

Structure 400 includes 25 light sources 450A-450Y. Light sources 450 may be configured as the light sources illustrated in FIG. 3. For example, light source 450A may have a node (e.g. cathode) coupled to transparent conductive row trace 411A and its other node (e.g. anode) coupled to transparent conductive column trace 417A. The light sources 450 may emit NIR light and be either a micro-LED or a VCSEL.

In the illustrated embodiments, illumination logic 499 may provide a voltage to a transparent conductive trace 411 or 417 from either side. Transparent conductive materials may have impedance profiles with more resistance than copper or gold traces. Consequently, the available voltage may noticeably diminish as the length of the transparent conductive trace increases. Having the ability to drive a voltage from either side of the trace 411/417 may increase the brightness uniformity of the light sources when they are driven because the provided power will be less attenuated due to the resistance of the transparent conductive material at length. In some embodiments, the outputs of illumination logic 499 are coupled to only one side of the transparent conductive trace 411/417 and the voltage is adjusted to compensate for voltage drop across the trace. For example, if the output X15 was removed, a higher voltage (e.g. ~3.3

VDC) may be driven onto column trace X11 to drive light source 450U while a lower voltage (e.g. 3 VDC) may be driven onto column trace X11 to drive light source 450A. In the illustrated embodiment, driving light source 450A may include driving a voltage of 3 VDC onto output X11 to power column trace 417A while grounding output X1 to ground row trace 411A. In the illustrated embodiment, driving light source 450R may include driving a voltage of 3 VDC onto output X17 to power column trace 417C while grounding output X4 to ground row trace 411D.

Figure 5:
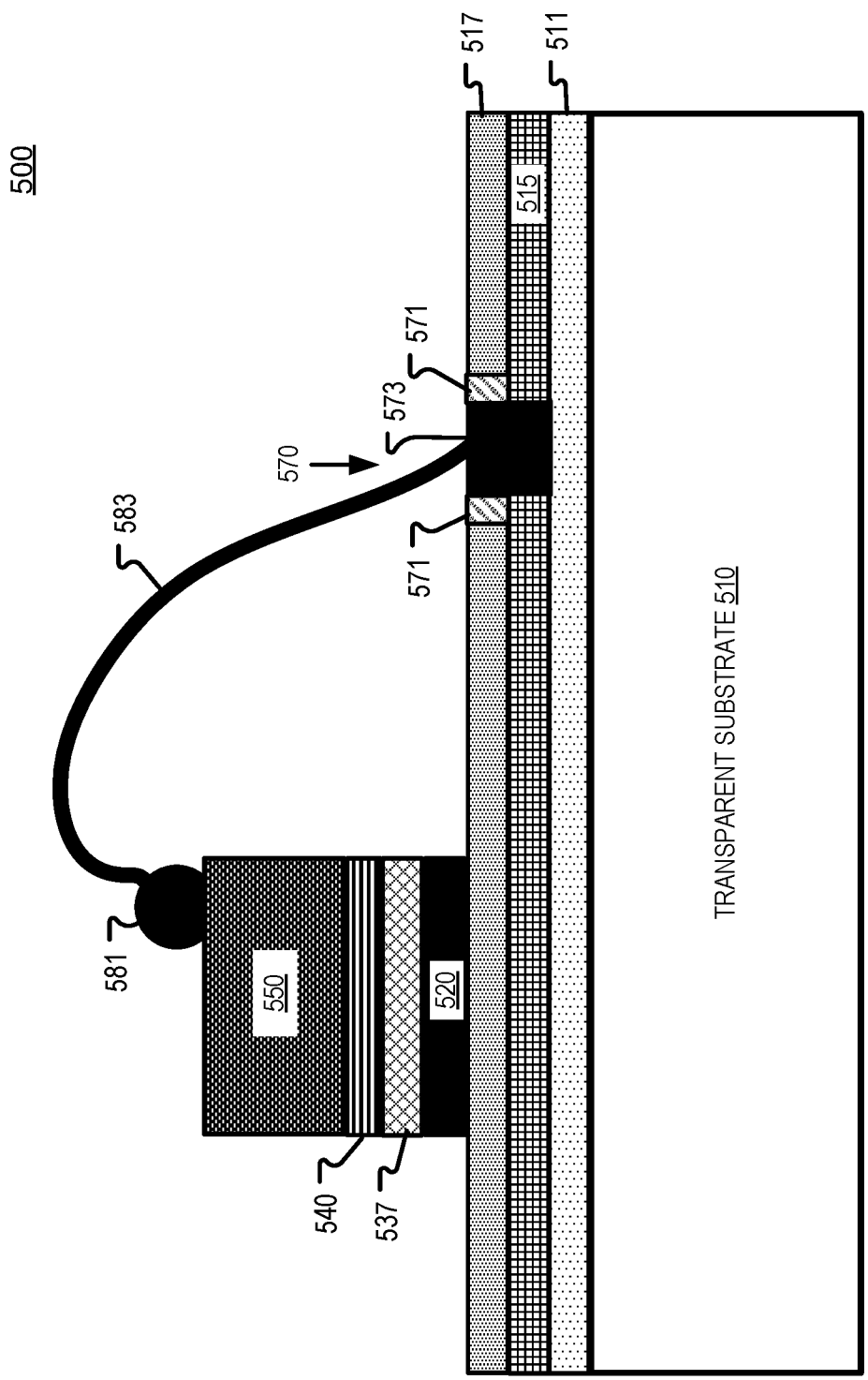
FIG. 5 illustrates an example optical structure including a multilayer transparent circuit board including an example via for driving a light source, in accordance with an embodiment of the disclosure.

FIG. 5 illustrates an example optical structure 500 including a multilayer transparent circuit board including an example via for driving a light source, in accordance with an embodiment of the disclosure. Structure 500 of FIG. 5 includes a transparent substrate 510, a transparent conductive layer 511, an insulation layer 515, a transparent conductive layer 517, an activation layer 520, a conductive pad 537, a die attach layer 540, a light source 550, and a wire bond that includes a ball 581 and a wire 583. Structure 500 also includes a via 570 running through transparent conductive layer 517 and insulation layer 515. Via 570 includes an insulator 571 disposed on sidewalls of a void through the transparent conductive layer 517. Via 570 also includes a conductive fill material 573 (e.g. gold or copper) on the inside of the insulator and contacting the transparent conductive layer 511 to provide an electrical path between the light source 550 and the transparent conductive layer 511. As illustrated, the conductive fill material 573 of the via 570 also runs through the insulation layer 515.

Via 570 may be formed by etching a void in the insulation layer 515 and the transparent conductive layer 517. Then, an insulation layer is formed on the sidewalls of the void. An additional etching process step may be required to remove the unwanted portions of the insulation layer from the bottom of the void to re-expose transparent conductive layer 511. The conductive fill material 573 is then formed in the void insulated by insulator 571.

Light source 550 may be similar to light source 150. Light source 550 includes a first node (e.g. a cathode) and a second node (e.g. an anode) for illuminating the light source 550. In the illustrated embodiment, anode is electrically coupled to the transparent conductive layer 517 and the other node is electrically coupled to transparent conductive layer 511 through ball 581, wire 583, and via 570. A node of light source 550 is electrically coupled to the transparent conductive layer 517 via a die attach layer 540 (e.g. solder or conductive epoxy), a conductive pad 537 (e.g. gold) and activation layer 520 (e.g. tin). In one embodiment, (not illustrated), the layers 520, 537, and 540 are replaced by a conductive adhesive coupled between transparent conductive layer 517 and light source 550. The other node of light source 550 is coupled to transparent conductive layer 511 through the wirebond and the via 570.

Figure 6A:
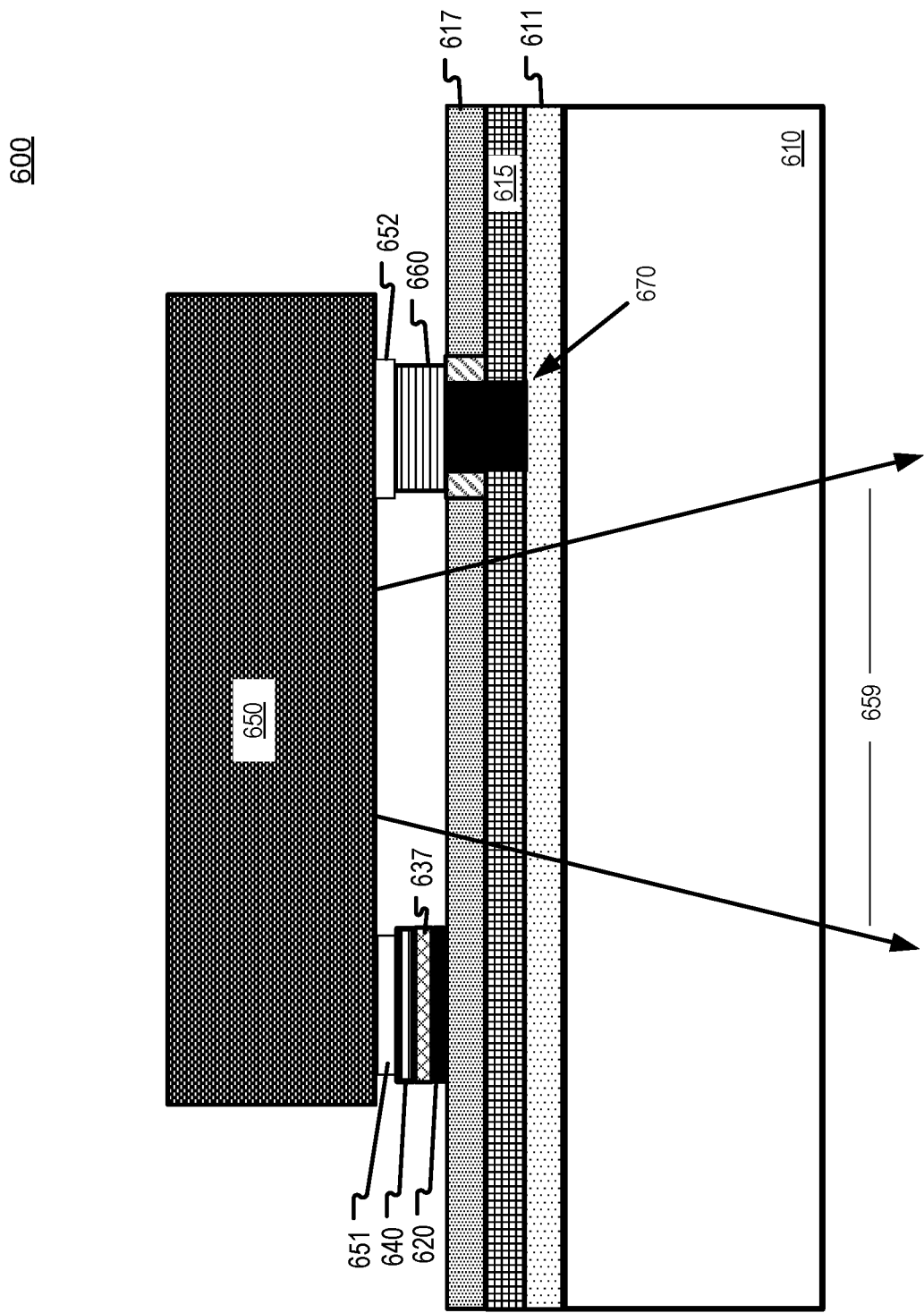
FIGS. 6A and 6B illustrate example optical structures including a light source of a flipchip configuration emitting source light back through transparent conductive layers that carry current to drive the light source, in accordance with an embodiment of the disclosure.

FIG. 6A illustrates an example optical structure 600 including a light source of a flipchip configuration emitting source light back through transparent conductive layers that carry current to drive the light source, in accordance with an embodiment of the disclosure. Structure 600 of FIG. 6A includes a transparent substrate 610, a transparent conductive layer 611, an insulation layer 615, a transparent conductive layer 617, an activation layer 620, a conductive pad 637, attach layers 640 and 660, and a light source 650 including nodes 651 and 652. Structure 600 also includes a via 670 (similar to via 570) running through transparent conductive layer 617 and insulation layer 615 and contacting the transparent conductive layer 611 to provide an electrical path between node 652 and the transparent conductive layer 611. In FIG. 6A, transparent conductive layers 611 and 617 may be a transparent conductive oxide and insulation layer 615 may be a transparent dielectric such as silicon dioxide. Activation layer 620 may include tin, chromium, and/or titanium-tungsten (TiW). Conductive pads 637 may include gold. Attach layers 640 and 660 may include solder. In one embodiment, attach layer 640 includes a conductive epoxy and layers 620, 637, and 640 are replaced with a conductive epoxy layer to form the electrical path between node 651 and transparent conductive layer 617.

Light source 650 is illustrated in a "flipchip" package configuration having nodes 651 and 652 disposed on a same side of the light source 650. In FIG. 6A, light source 650 is configured in a top-emitting package where the source light 659 emitted by light source 650 propagates through layers 617, 615, 611, and 610. Source light 659 may be NIR light.

Figure 6B:
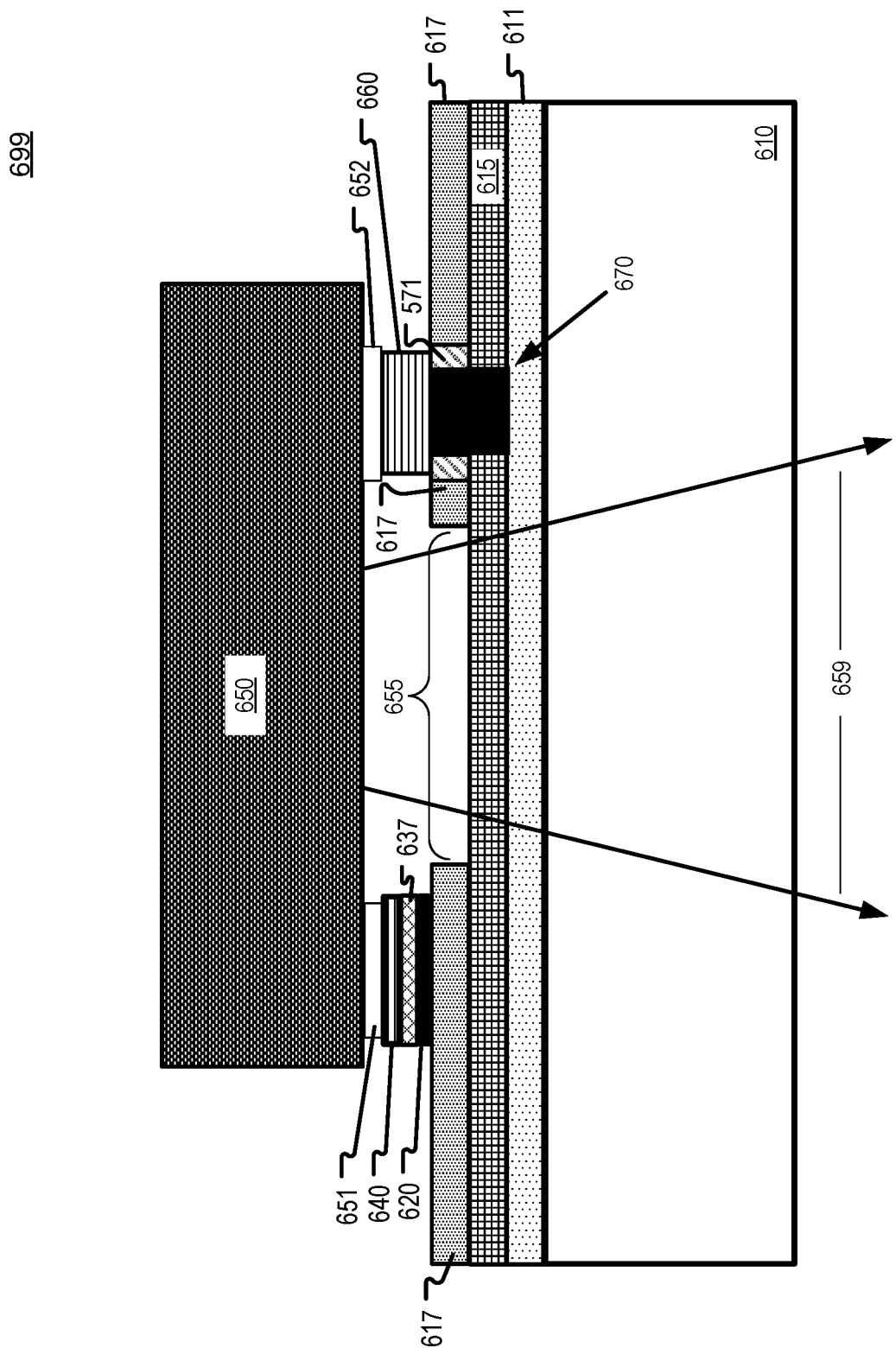

FIG. 6B illustrates an example optical structure 699 including a light source of a flipchip configuration emitting source light back through one transparent conductive layer, in accordance with an embodiment of the disclosure. FIG. 6B is similar to optical structure 600 although a source light void 655 of transparent conductive layer 617 allows source light 659 to propagate without encountering transparent conductive layer 617. Since source light 659 does not encounter transparent conductive layer 617 in FIG. 6B, less of source light 659 will be absorbed which may add to the efficiency of optical structure 699. When ITO is used as a transparent conductive layer 617, the infrared absorption of source light 659 will be reduced when source light void 655 is included. In FIG. 6B, source light void 655 in transparent conductive layer 617 is disposed between nodes 651 and 652. Source light void 655 may be fabricated by forming transparent conductive layer 617 in a pattern or etching away the source light void 655 from transparent conductive layer 617 in a subtractive process.

Figure 7:
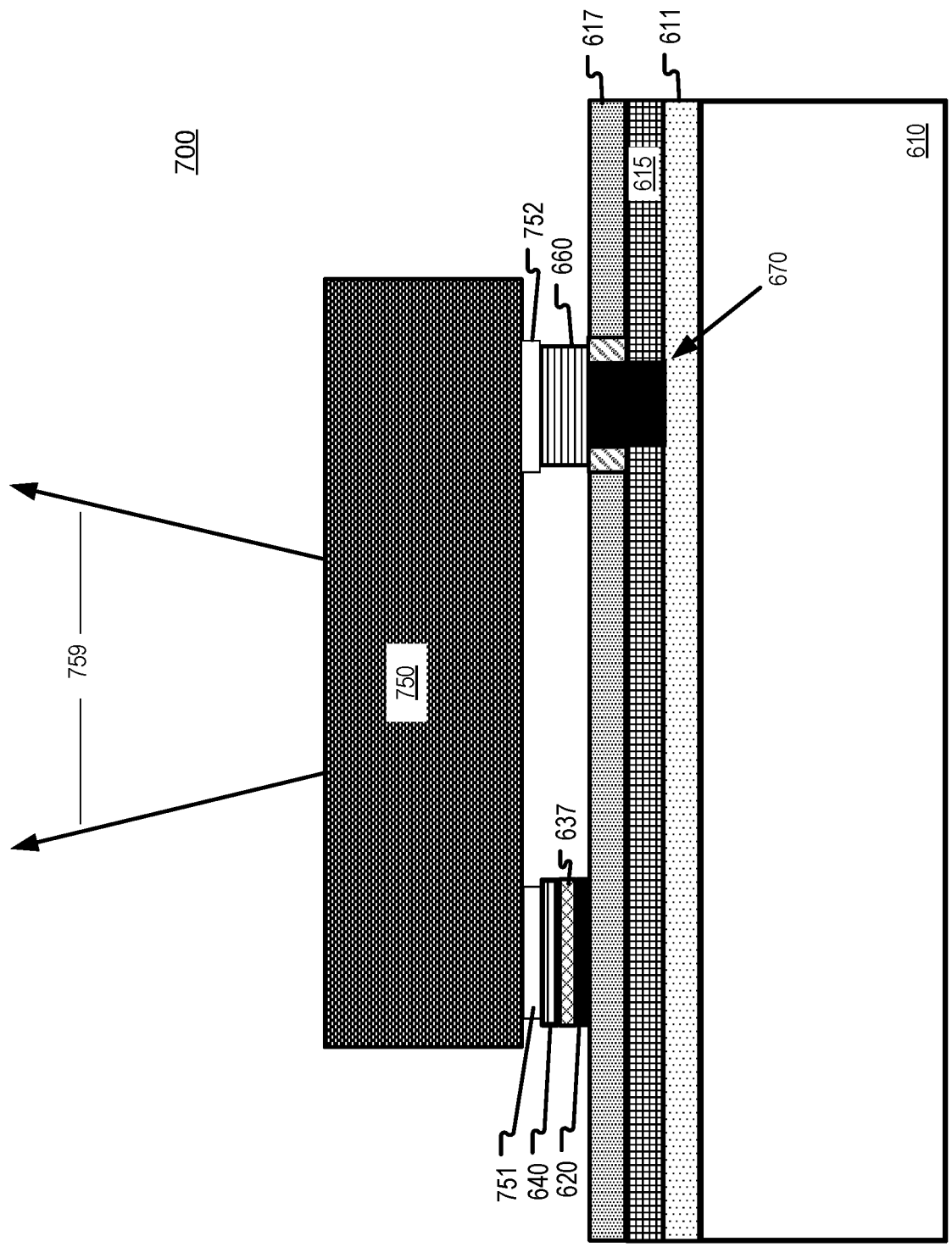
FIG. 7 illustrates an example optical structure including a bottom emitting light source of a flipchip configuration emitting source light away from transparent conductive layers that carry current to drive the light source, in accordance with an embodiment of the disclosure.

FIG. 7 illustrates an example optical structure including a bottom emitting light source of a flipchip configuration emitting source light away from transparent conductive layers that carry current to drive the light source, in accordance with an embodiment of the disclosure. Optical structure 700 in FIG. 7 is similar to optical structure 600 in FIG. 6A although light source 650 is replaced with a bottom-emitting light source 750 having nodes 751 (e.g. anode) and 752 (e.g. cathode).

Figure 8:
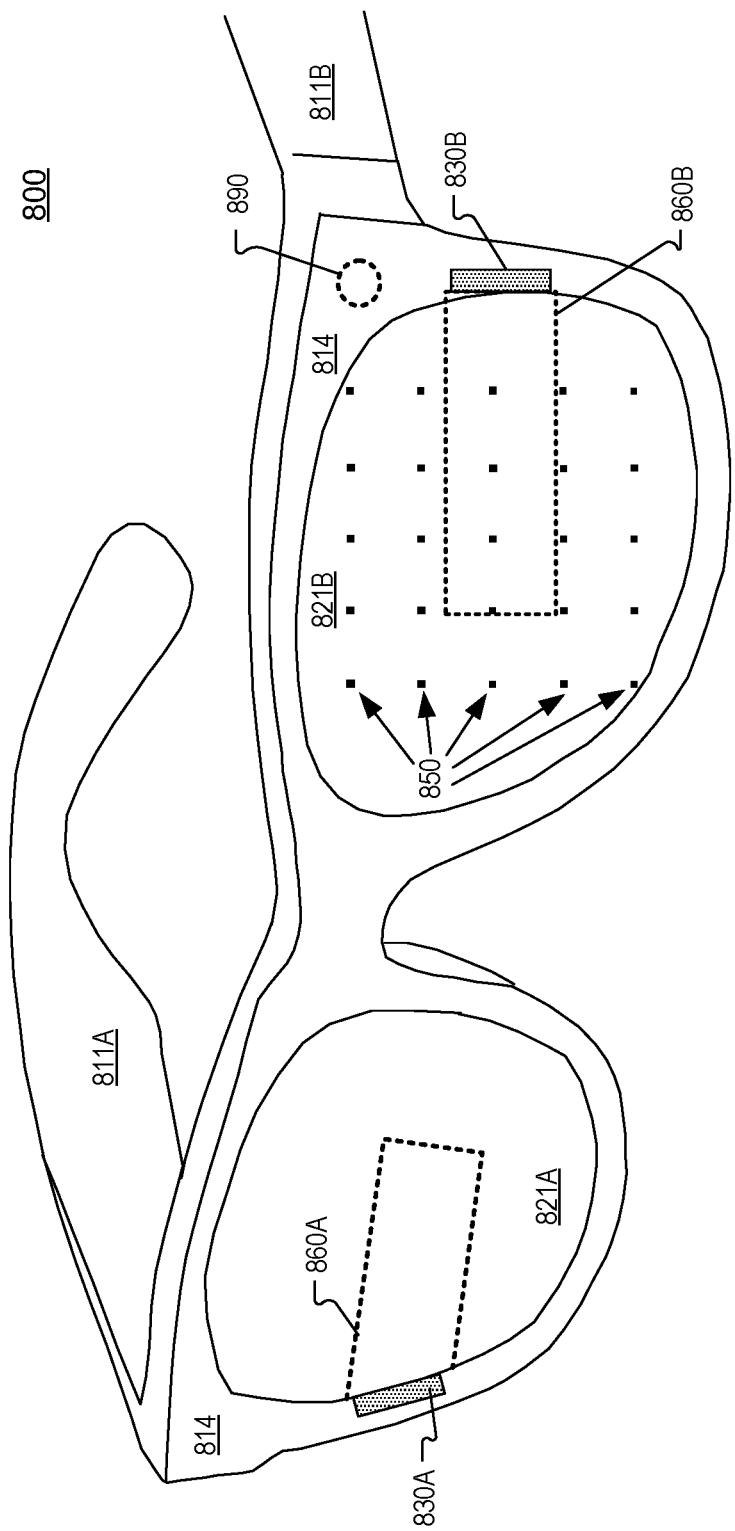
FIG. 8 illustrates an example head mounted display (HMD) that includes an array of light sources emitting infrared light in an eyebox direction, in accordance with an embodiment of the disclosure.

FIG. 8 illustrates an example head mounted display (HMD) 800 that includes an array of light sources emitting infrared light in an eyebox direction, in accordance with an embodiment of the disclosure. HMD 800 includes frame 814 coupled to arms 811A and 811B. Lenses 821A and 821B are mounted to frame 814. Lenses 821 may be prescription lenses matched to a particular wearer of HMD or non-prescription lenses. The illustrated HMD 800 is configured to be worn on or about a head of a user of the HMD.

In FIG. 8, each lens 821 includes a waveguide 860 to direct image light generated by a display 830 to an eyebox area for viewing by a wearer of HMD 800. Display 830 may include an LCD, an organic light emitting diode (OLED) display, micro-LED display, quantum dot display, pico-projector, or liquid crystal on silicon (LCOS) display for directing image light to a wearer of HMD 800.

The frame 814 and arms 811 of the HMD may include supporting hardware of HMD 800. HMD 800 may include any of processing logic, wired and/or wireless data interface for sending and receiving data, graphic processors, and one or more memories for storing data and computer-executable instructions. In one embodiment, HMD 800 may be configured to receive wired power. In one embodiment, HMD 800 is configured to be powered by one or more batteries. In one embodiment, HMD 800 may be configured to receive wired data including video data via a wired communication channel. In one embodiment, HMD 800 is configured to receive wireless data including video data via a wireless communication channel.

Lenses 821 may appear transparent to a user to facilitate augmented reality or mixed reality where a user can view scene light from the environment around her while also receiving image light directed to her eye(s) by waveguide(s) 860. Lenses 821 may be considered an optical combiner. Those skilled in the art understand that the array of light sources 850 on a transparent substrate could also be included advantageously in a VR headset where the transparent nature of the optical structure allows a user to view a display in the VR headset. In some embodiments of FIG. 8, image light is only directed into one eye of the wearer of HMD 800. In an embodiment, both displays 830A and 830B are included to direct image light into waveguides 860A and 860B, respectively.

Lens 821B includes an array of light sources 850 arranged in a 5×5 array. Each light source 850 may be disposed on lenses 821 using the configurations and techniques described in association with FIGS. 1-7. Lenses 821 may replace the transparent substrate 110/310/510/610. The array of light sources 850 may be infrared light sources directing their source light in an eyeward direction to an eyebox area of a wearer of HMD 800. Lens 821A may be configured similarly to the illustrated lens 821B.

In previous eye illumination solutions, infrared light sources for eye-tracking purposes were disposed around a rim of a lens. However, placing the light sources directly in front of the eye may be advantageous for calibration and computation of "glint" reflections that can be imaged by a camera such as camera 890 that is positioned to image the eye of a wearer of HMD 800. Furthermore, the ability to selectively illuminate each light source 850 individually (or in groups) may help save power and provide more faster and more precise eye-tracking measurements.

While light sources 850 may introduce occlusions into an optical system included in an HMD 800, the light sources 850 and corresponding routing (e.g. vias 570/670 and pads 135/335) may be so small as to be unnoticeable or insignificant to a wearer of an HMD. Additionally, any occlusion from light sources 850 will be placed so close to the eye as to be unfocusable by the human eye and therefore assist in the light sources 850 being not noticeable or insignificant. In some embodiments, each light source 850 is less than 100×100 microns.

Due to the small size of the light sources, a display that appears transparent to a user that displays images in the visible spectrum may be fabricated with visible light micro-LEDs or visible light VCSELs. A Red-Green-Green-Blue (RGGB) sub-pixel pattern of micro-LEDs or VCSELs may be used for each pixel. To fabricate a transparent display, a multilayer transparent circuit board having transparent routing (e.g. transparent conductive oxide) may be used. Vias such as via 570 may be used to provide routing to different layers of the multilayer transparent circuit board. Transparent conductive layers may be patterned to provide column traces and row traces and illumination logic may provide power to the column traces and row traces to selectively drive the light sources to emit light, as in FIG. 4. Although the display would have occlusions from the light sources, the tiny size of each light source may allow for the space around the light sources to still allow a high percentage of scene light (e.g. scene light from an ambient environment) to propagate to the eye of the user so the user can view her environment, while also receiving image light generated by the light sources of the display.

The term "illumination logic" (e.g. 499) in this disclosure may include one or more processors, microprocessors, multi-core processors, Application-specific integrated circuits (ASIC), and/or Field Programmable Gate Arrays (FPGAs) to execute operations disclosed herein. In some embodiments, memories (not illustrated) are integrated into the illumination logic to store instructions to execute operations and/or store data. The illumination logic may also include analog or digital circuitry to perform the operations in accordance with embodiments of the disclosure.

A "memory" or "memories" described in this disclosure may include one or more volatile or non-volatile memory architectures. The "memory" or "memories" may be removable and non-removable media implemented in any method or technology for storage of information such as computer-readable instructions, data structures, program modules, or other data. Example memory technologies may include RAM, ROM, EEPROM, flash memory, CD-ROM, digital versatile disks (DVD), high-definition multimedia/data storage disks, or other optical storage, magnetic cassettes, magnetic tape, magnetic disk storage or other magnetic storage devices, or any other non-transmission medium that can be used to store information for access by a computing device.

Embodiments of the invention may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A device comprising:
   a transparent substrate;
   a first transparent conductive layer disposed over the transparent substrate;
   a second transparent conductive layer;
   an insulation layer disposed between the first transparent conductive layer and the second transparent conductive layer;
   a light source having a first node and a second node, the first node electrically coupled to the first transparent conductive layer and the second node electrically coupled to the second transparent conductive layer, wherein the light source is configured to emit non-visible light in an eyebox direction for eye-tracking;
   an activation layer adhering to the second transparent conductive layer; and
   a conductive pad coupled to the activation layer, wherein the second node of the of the light source is electrically coupled to the second transparent conductive layer through the activation layer and the conductive pad.

2. The device of claim 1, wherein the second node of the light source is wire-bonded to the second transparent conductive layer.

3. The device of claim 1, wherein the light source is configured to emit the non-visible light through the first transparent conductive layer and the transparent substrate, and wherein a source light void in the second transparent conductive layer is disposed between the first node and the second node.

4. The device of claim 1, wherein the first node and the second node of the light source are on a bottom side of the light source.

5. The device of claim 1 further comprising:
   a die window void sized to accommodate a footprint of the light source, wherein the die window void is through the insulation layer and the second transparent conductive layer.

6. The device of claim 1 further comprising:
   a conductive epoxy layer coupled between the first node of the light source and the first transparent conductive layer.

7. The device of claim 1, wherein the first node is coupled to the first transparent conductive layer through a via running through the second transparent conductive layer and the insulation layer.

8. The device of claim 1, wherein the light source includes a light emitting diode (LED) having an anode and a cathode, and wherein the first node of the light source is the cathode or anode.

9. The device of claim 1, wherein the light source includes a vertical-cavity surface-emitting laser (VCSEL).

10. The device of claim 1, wherein the first transparent conductive layer includes indium tin oxide, and wherein the second transparent conductive layer includes indium tin oxide.

11. The device of claim 1, further comprising a near-eye optical element, wherein the transparent substrate, the first transparent conductive layer, the second transparent conductive layer, and the insulation layer are included in the near-eye optical element for positioning within 50 mm of a human eye.

12. The device of claim 1, wherein the non-visible light is near-infrared (NIR) light.

13. A device of an eye-tracking system, the device comprising:
   a first transparent conductive layer, wherein the first transparent conductive layer is segmented into a plurality of conductive column traces;
   a second transparent conductive layer segmented into a plurality of conductive row traces;
   an insulation layer disposed between the first transparent conductive layer and the second transparent conductive layer; and
   an array of light sources having a first node and a second node, wherein the first node is electrically coupled to one of the conductive column traces, and wherein the second node is electrically coupled to one of the conductive row traces, wherein the array of light sources is configured to emit non-visible light in an eyebox direction for eye-tracking.

14. The device of claim 11, further comprising a lens or an optical combiner of a head mounted display (HMD), wherein the first transparent conductive layer, the second transparent conductive layer, the insulation layer, and the array of light sources are included in the lens or the optical combiner for positioning within 50 mm of a human eye.

15. The device of claim 13, wherein the non-visible light is near-infrared (NIR) light.

16. The device of claim 13 further comprising:
   illumination logic coupled to selectively illuminate the array of light sources by selectively providing electrical power to the conductive column traces or the conductive row traces.

17. The device of claim 13, wherein the conductive column traces are electrically isolated from each other and the conductive row traces are electrically isolated from each other.

18. The device of claim 13, wherein the conductive row traces are disposed approximately orthogonal to the conductive column traces.

19. The device of claim 11, wherein the near-eye optical element is a lens or an optical combiner of a head mounted display (HMD).

* * * * *